(12) United States Patent
Swire et al.

(10) Patent No.: US 11,538,732 B2
(45) Date of Patent: Dec. 27, 2022

(54) METHOD FOR FORMING BOARD ASSEMBLY WITH CHEMICAL VAPOR DEPOSITION DIAMOND (CVDD) WINDOWS FOR THERMAL TRANSPORT

(71) Applicant: Microchip Technology Caldicot Limited, Caldicot (GB)

(72) Inventors: Philip Andrew Swire, Chepstow (GB); Nina Biddle, Coleford (GB)

(73) Assignee: MICROCHIP TECHNOLOGY CALDICOT LIMITED, Caldicot (GB)

( * ) Notice: Subject to any disclaimer, the term of this patent is extended or adjusted under 35 U.S.C. 154(b) by 0 days.

(21) Appl. No.: 17/493,476

(22) Filed: Oct. 4, 2021

(65) Prior Publication Data

US 2022/0028753 A1   Jan. 27, 2022

Related U.S. Application Data

(62) Division of application No. 16/569,252, filed on Sep. 12, 2019, now Pat. No. 11,189,543.

(Continued)

(51) Int. Cl.
*H01L 23/373*    (2006.01)
*H01L 23/29*     (2006.01)
*H01L 23/00*     (2006.01)

(52) U.S. Cl.
CPC ........ *H01L 23/3732* (2013.01); *H01L 23/295* (2013.01); *H01L 23/3735* (2013.01);
(Continued)

(58) Field of Classification Search
CPC ............... H01L 23/3732; H01L 23/295; H01L 23/3735; H01L 24/29; H01L 24/32; H01L 24/33; H01L 24/73; H01L 24/92; H01L 2224/29393; H01L 2224/32225; H01L 2224/3316; H01L 2224/73253;
(Continued)

(56) References Cited

U.S. PATENT DOCUMENTS 4,249,347 A    2/1981   Bura et al.
16,569,252     9/2019   Swire
(Continued)

FOREIGN PATENT DOCUMENTS

EP    3496140 A1    6/2019

OTHER PUBLICATIONS

PCT/GB2019/053365, International Search Report and Written Opinion, European Patent Office, dated Apr. 23, 2020.
(Continued)

*Primary Examiner* — Didarul A Mazumder
(74) *Attorney, Agent, or Firm* — Glass & Associates; Kenneth Glass (57)    ABSTRACT

A method for forming a board assembly includes identifying a location of a hot-spot on a semiconductor die and cutting an opening in a circuit board corresponding to the location of the identified hot-spot. A Chemical Vapor Deposition Diamond (CVDD) window is inserted into the opening. A layer of thermally conductive paste is applied over the CVDD window. The semiconductor die is placed over the layer of thermally conductive paste such that the CVDD
(Continued)

window underlies the hot-spot and such that a surface of the semiconductor die is in direct contact with the layer of thermally conductive paste.

16 Claims, 11 Drawing Sheets

Related U.S. Application Data (60) Provisional application No. 62/881,334, filed on Jul. 31, 2019.

(52) U.S. Cl.
CPC .............. *H01L 24/29* (2013.01); *H01L 24/32* (2013.01); *H01L 24/33* (2013.01); *H01L 24/73* (2013.01); *H01L 24/92* (2013.01); H01L 2224/29393 (2013.01); H01L 2224/32225 (2013.01); H01L 2224/3316 (2013.01); H01L 2224/73253 (2013.01); H01L 2224/73265 (2013.01); H01L 2224/92225 (2013.01); H01L 2224/92247 (2013.01)

(58) Field of Classification Search
CPC . H01L 2224/73265; H01L 2224/92225; H01L 2224/92247
USPC .......................................................... 257/687
See application file for complete search history.

(56) References Cited

U.S. PATENT DOCUMENTS

| | | |
|---|---|---|
| 11,189,543 B2 | 11/2021 | Swire |
| 2007/0081340 A1* | 4/2007 | Chung ..................... F21K 9/00 362/294 |
| 2007/0144182 A1 | 6/2007 | Sauciuc et al. |
| 2007/0201247 A1* | 8/2007 | Ohno ................... G02B 6/0085 362/257 |
| 2007/0242462 A1* | 10/2007 | Van Laanen ........ F21V 19/0055 362/373 |
| 2007/0295496 A1 | 12/2007 | Hall et al. |
| 2008/0186682 A1* | 8/2008 | Sugimura ............ H05K 3/3485 361/720 |
| 2014/0150571 A1 | 6/2014 | Kuniyoshi et al. |
| 2015/0334877 A1* | 11/2015 | Kawagoe ............. H01L 23/492 361/709 |
| 2016/0141232 A1 | 5/2016 | Cannon |
| 2018/0153030 A1* | 5/2018 | Viswanathan ...... H01L 23/3735 |

OTHER PUBLICATIONS

Bowman, Amy Katherine, A Selective Encapsulation Solution for Packaging an Optical Microelectromechanical System, Thesis Submitted to the Facultyof the Worcester Polytechnic Institute, Jan. 2002.

* cited by examiner

METHOD FOR FORMING BOARD ASSEMBLY WITH CHEMICAL VAPOR DEPOSITION DIAMOND (CVDD) WINDOWS FOR THERMAL TRANSPORT

BACKGROUND

Semiconductor die require effective thermal transport to prevent heat buildup that can impair performance of the die and permanently damage to the die. Various mechanisms have been used in the past to remove heat from die. The most common mechanism is the use of metallic fins that attach to the top of the die via thermally conductive adhesive. This has worked well in the past for single-board designs. However, with multi-board assemblies in which die are placed between two boards, there is no way to place metallic fins directly over the die.

Chemical Vapor Deposition Diamond (CVDD) has a very high thermal conductivity and can be formed in thin sheets. These sheets are commonly cut using special saws to obtain different shapes of diamond sheeting for use in a variety of commercial applications. Pastes made up of CVDD grains are much less expensive than CVDD sheets. Though diamond pastes have been used for thermal conveyance in the field of semiconductors, CVDD sheets and shapes have not been widely adopted because of their expense.

Accordingly, there is a need for a method and apparatus that is not overly expensive and that will provide sufficient thermal transport so as to prevent in heat buildup within individual die. Also, there is a need for a method and apparatus that can be used to convey heat away from die that can be used with multi-board assemblies.

BRIEF DESCRIPTION

A board assembly is disclosed that includes a circuit board, a semiconductor die electrically coupled to the circuit board, a Chemical Vapor Deposition Diamond (CVDD) window, and a layer of thermally conductive paste in direct contact with a first surface of the CVDD window along the full extent of the first surface of the CVDD window and in direct contact with the semiconductor die. The layer of thermally conductive paste is positioned so that it covers a hot-spot on the semiconductor die. The CVDD window has a footprint that is less than twenty percent of the footprint of the semiconductor die.

A method for forming a board assembly is disclosed that includes identifying a location of a hot-spot on a semiconductor die and cutting an opening in a circuit board corresponding to the location of the identified hot-spot. A CVDD window having a shape corresponding to the shape (and position) of the hot-spot is inserted into the opening. A layer of thermally conductive paste sufficient to ensure contact between the diamond window and the hot-spot (less than 40 µm thick) is then placed over the CVDD windows and the die is positioned over the layer of thermally conductive paste such that the CVDD window underlies the hot-spot and such that a surface of the semiconductor die is in direct contact with the layer of thermally conductive paste.

A method for forming a board assembly is disclosed that includes identifying a location of a hot-spot on a semiconductor die; attaching a CVDD window onto a surface of a thermally conductive plate, in a location corresponding to the location of the hot-spot on the semiconductor die; applying a layer of thermally conductive paste over the attached CVDD window; attaching a semiconductor die to a circuit board such that the semiconductor die is electrically coupled to the circuit board; and placing the thermally conductive plate over the semiconductor die so that the applied layer of thermally conductive paste is in contact with the semiconductor die and such that the CVDD window overlies the hot-spot.

Because of the high thermal conductivity of the CVDD windows and the positioning of the windows beneath hot-spots, heat is quickly and effectively removed from the die. Also, the CVDD windows have a surface area that is significantly less than the entire surface area of the die. Thus, the cost of the CVDD window material is significantly less than the cost would be if the lateral extent of the CVDD material were to be the same as the footprint of the die.

BRIEF DESCRIPTION OF THE DRAWING FIGURES

The invention will be explained in more detail in the following with reference to embodiments and to the drawing in which are shown. It is appreciated that the drawings are not drawn to scale.

DETAILED DESCRIPTION

Persons of ordinary skill in the art will realize that the following description is illustrative only and not in any way limiting. Other embodiments will readily suggest themselves to such skilled persons.

Figure 1:
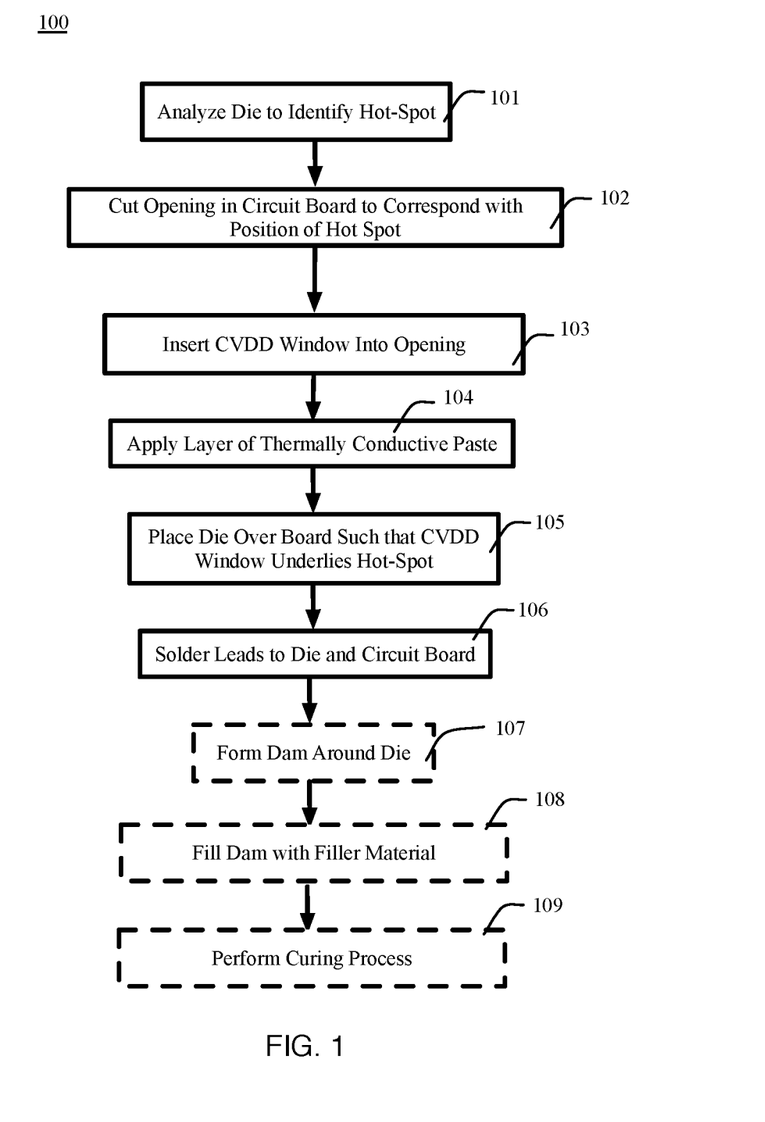
FIG. 1 is a block diagram showing a method for forming a board assembly having CVDD windows in accordance with an embodiment of the invention.

FIG. 1 shows a method 100 for forming a board assembly having CVDD windows. As shown by step 101 the thermal properties of a plurality of test semiconductor die are analyzed to identify the location of hot-spots on the semiconductor die. Hot spots may be identified using a thermal camera image of the surface of the test semiconductor die when the test semiconductor die is operating in a nominal manner (or in a conventional test mode) to accurately identify the position of the hot-spots. These locations are then accurately mapped. The definition of a "hot-spot" is a small area within a die that has an elevated heat output compared to the surrounding area of that die. Areas having a temperature of more than ten percent above the surrounding area of the die, or more than ten percent above an average temperature of the surface of the die, are in an exemplary embodiment determined to be hot-spots.

Figure 6:
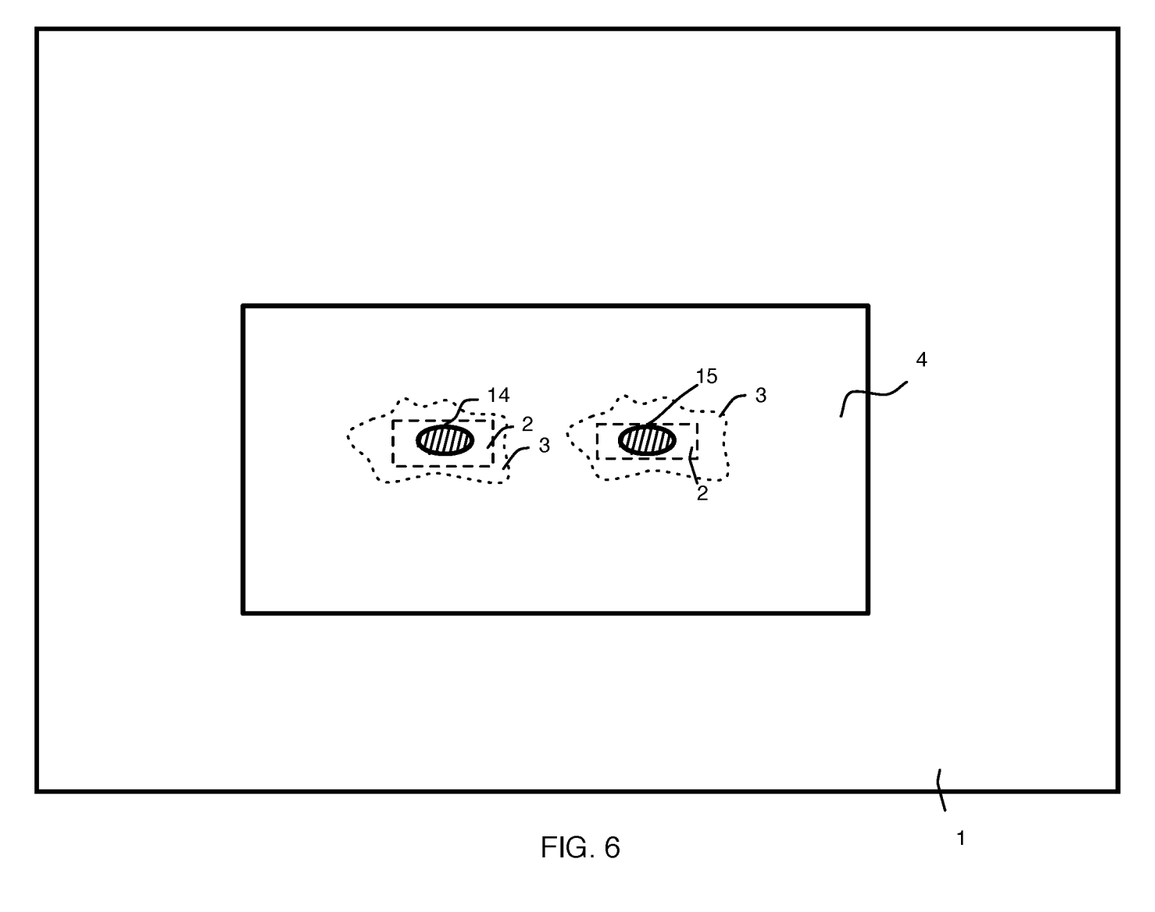
FIG. 6 is a diagram showing a top view of the circuit board assembly of FIG. 5 in accordance with an embodiment of the invention.

In the embodiment shown in FIG. 6 the analysis identifies hot-spots and on a test semiconductor die that is similar to semiconductor die 4. The location of identified hot-spots are shown for illustration purposes in locations 14-15 on die 4 of FIG. 6. However, it is appreciated that the process of identifying the location of hot-spots 14-15 will be done on a test die (not shown) prior to the assembly process, and not necessarily determined using the semiconductor die 4 that will be used in the assembly process. The test semiconductor die used to identify the hot-spots will preferably have the same design and manufacture of the semiconductor die 4 used in the board assembly so that the position of the hot-spots can be accurately determined.

An opening is cut 102 in a circuit board that correspond with the position of each hot spot identified in step 101. In one embodiment the openings are cut using a laser. In the embodiment shown in FIG. 2, opening 10 is cut so as to have a location on circuit board 1 corresponding to the location of hot-spot 14 on die 4 and opening 11 is cut so as to have a location on circuit board 1 corresponding to the location of hot-spot 15 on die 4. The location of the openings may be determined by identifying where the hot-spots are in relationship to an alignment indicator on die 4, precisely establishing the location on circuit board 1 where die 4 will be attached, determining where the alignment indicator will be positioned on circuit board 1 and using the position of the hot spots relative to the alignment indicator to determine where openings 10-11 need to be cut.

Figures 2, 3:
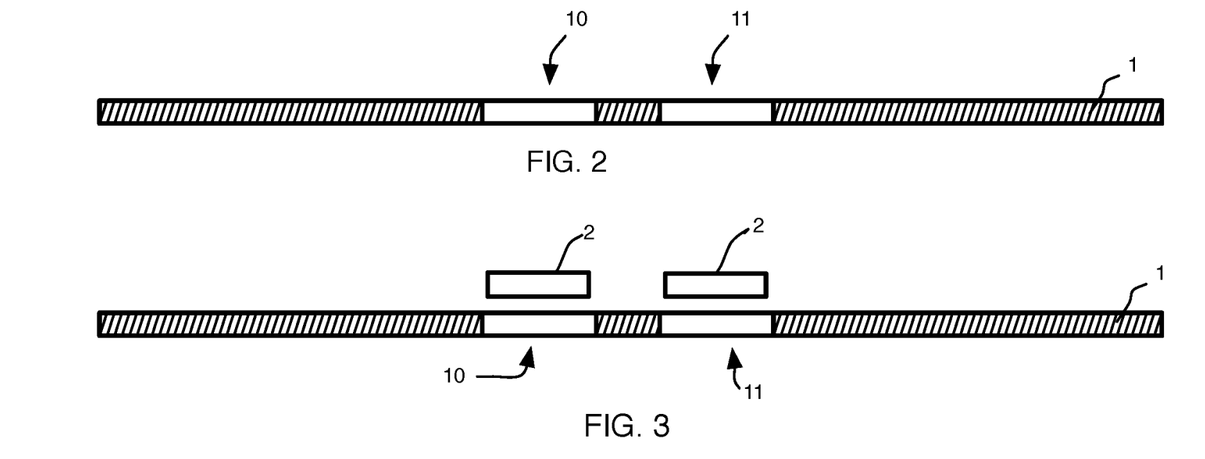
FIG. 2 is a diagram showing a cross-sectional view of a circuit board with openings corresponding to identified hot spots.
FIG. 3 is a diagram showing a cross-sectional view of the circuit board of FIG. 2 and that illustrates CVDD windows that are to be inserted into the openings in the circuit board in accordance with an embodiment of the invention.
Figure 16:
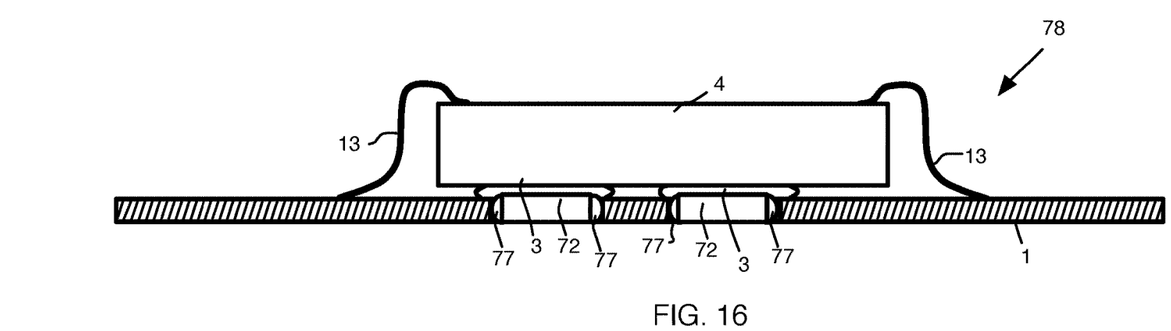
FIG. 16 is a diagram showing a circuit board assembly having a CVDD window that extends above the top surface of the circuit board in accordance with an embodiment of the invention.
Figure 17:
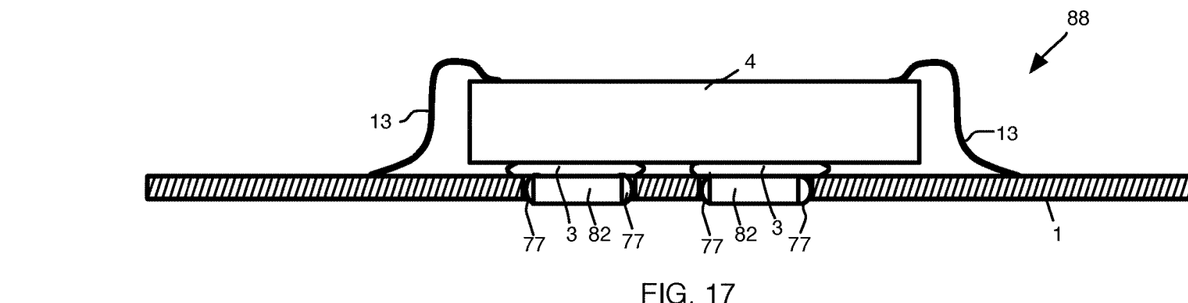
FIG. 17 is a diagram showing a circuit board assembly having a CVDD window that extends below the bottom surface of the circuit board in accordance with an embodiment of the invention.
Figure 18:
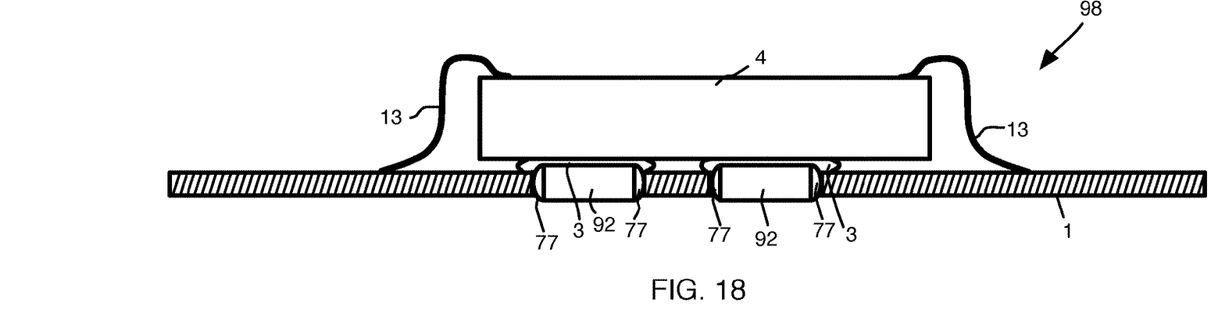
FIG. 18 is a diagram showing a circuit board assembly having a CVDD window that extends above the top surface of the circuit board and below the bottom surface of the circuit board in accordance with an embodiment of the invention.

A CVDD window 2 is inserted 103 into each opening 10, 11 cut in step 102, as shown in FIG. 3. CVDD windows may be formed by depositing a CVDD sheet and cutting the CVDD sheet with a laser. In one embodiment, CVDD sheets manufactured by Element Six of Santa Clara, Calif. are used to form CVDD windows 2. A pick-and-place device is used to precisely position the CVDD window 2 within each opening. It is appreciated that the size of CVDD window 2 will be less than the size of the opening 10, 11 into which it is placed so that it will fit into the opening. A plate (not shown) may be placed under circuit board 1 to hold the CVDD window in place until process 100 is complete. Alternatively, adhesive 77 may be applied to the edges of each CVDD window 2 so as to attach each CVDD window 2 to the edges of the respective opening 10, 11 as is illustrated in FIGS. 16-18. In this embodiment the adhesive extends between the side surface of the CVDD window and the side surface of the circuit board 1 at the corresponding opening 10, 11. The adhesive is cured prior to subsequent process steps 104-109 so as to hold the CVDD window 2 in place during subsequent process steps 104-109.

In the embodiment of method 100, all of the CVDD windows 2, taken together, have a footprint that is less than twenty percent of the footprint of the semiconductor die. However, it has been found that in many instances hot-spots cover less than two percent of the die area. In these embodiments, the amount of CVDD window material of all of the CVDD windows 20, taken together, will be from two to four percent of the die area.

Figures 4, 5:
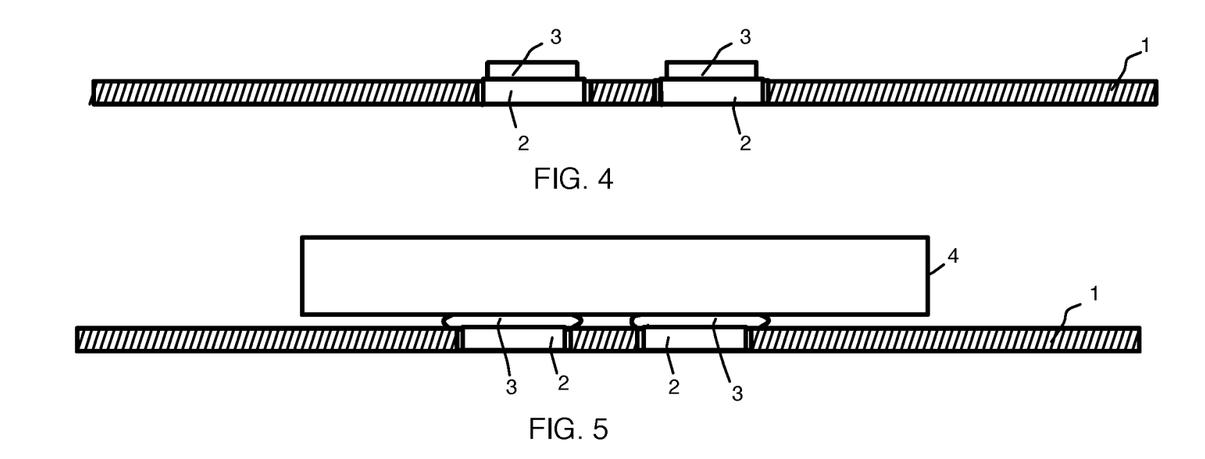
FIG. 4 is a diagram showing a side view of the circuit board assembly of FIG. 3 after the CVDD windows have been inserted into the openings in the circuit board, and after a layer of thermally conductive paste has been deposited over each CVDD window in accordance with an embodiment of the invention.
FIG. 5 is a diagram showing a side view of the circuit board assembly of FIG. 4 after a semiconductor die has been placed over the layer of thermally conductive paste such that CVDD windows are positioned below the hot-spots, in accordance with an embodiment of the invention.

As shown in FIG. 4, a layer of thermally conductive paste 3 is applied 104 over the CVDD windows 2. The thermally conductive paste 3 may be diamond paste with a CVDD loading of 70-90%, with CVDD grains having a size of 0.5-1 μm supported in organic resin and solvent.

In the present embodiment a layer of thermally conducting paste less than 40 μm thick is applied over each CVDD window 2. The application of this layer of thermally conductive paste 3 only over each CVDD window 2 conserves the relatively-expensive diamond paste while providing sufficient thermal conductivity to effectively conduct heat from die 4 to the underlying CVDD window 2. However, alternatively the thermally conductive paste 3 could be deposited over a wider area around each CVDD window 2 or extend laterally beneath the entire semiconductor die 4.

As shown in FIG. 5, semiconductor die 4 is placed 105 over the CVDD windows such that the CVDD windows 2 underlie the hot-spots, with semiconductor die 4 separated from the CVDD windows 2 by respective portions of thermally conductive paste 3. More particularly, as shown in FIG. 6, die 4 is positioned such that one CVDD window 2 underlies hot-spot 14 and a second CVDD window underlies hot-spot 15. The die may be pressed against the layer of thermally conductive paste 3 such that the layer of thermally conductive paste 3 fills any voids and excludes any air between a bottom surface of the semiconductor die 4, and a top surface of CVDD window 2 (and the top surface of circuit board 1) causing the layer of thermally conductive paste 3 to extend laterally as shown in FIGS. 5, 6 and to have reduced thickness.

In the embodiment shown in FIG. 6 the size of each CVDD window 2 is greater than the size of the corresponding hot-spot such that each CVDD window 2 extends beneath and encompasses the entire area of the overlying hot-spot. More particularly, the lateral extent of hot-spot 14 along the bottom surface of semiconductor die 4 is shown in FIG. 6 to be less than the lateral extent of the thermally conductive paste 3 such that the entire area of the bottom surface of semiconductor die 4 that lies within hot-spot 14 is in direct contact with thermally conductive paste 3. The lateral extent of CVDD window 2 that underlies hot-spot 14 is shown to be less than the lateral extent of the overlying thermally conductive paste 3 such that the entire area of the top surface of the CVDD window 2 is in direct contact with thermally conductive paste 3. Thereby, a thermally conductive path for expelling heat is provided across the entire lateral area of hot-spot 14 through the bottom surface of die 4.

Similarly, the lateral extent of hot-spot 15 along the bottom surface of semiconductor die 4 is less than the lateral extent of the thermally conductive paste 3 such that the entire area of the bottom surface of semiconductor die 4 that lies within hot-spot 15 is in direct contact with thermally conductive paste 3. Also, the lateral extent of CVDD window 2 that underlies hot-spot 15 is less than the lateral extent of the overlying thermally conductive paste 3 such that the entire area of the top surface of the CVDD window 2 is in direct contact with thermally conductive paste 3. Thereby, a thermally conductive path for expelling heat is provided across the entire area of hot-spot 15.

In other embodiments the CVDD windows 2 may be smaller than the size of the overlying hot-spot 14, 15 and thus will not extend laterally beyond the lateral extent of the overlying hotspot (e.g., the footprint of the CVDD window is smaller than the footprint of the corresponding hot-spot on the semiconductor die 4). In this embodiment the thermally conductive path for expelling heat will not have the same lateral extent as the overlying hot-spot, but will still effectively convey heat from the overlying hot-spot as long as the lateral extent of the thermally conductive paste covers the entire hot-spot (e.g., extends laterally beneath all of the overlying hot-spot). In other embodiments the alignment may not be perfect and portions of the overlying hot-spot may not be fully within the footprint of the CVDD window or the diamond paste.

Figure 7:
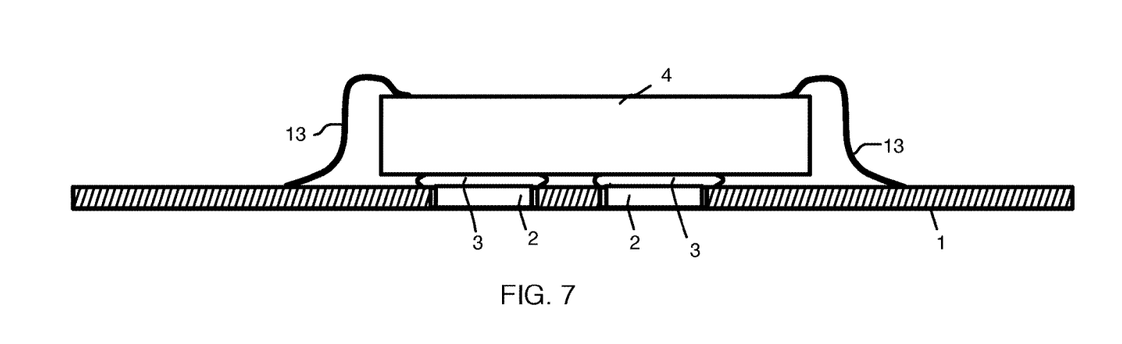
FIG. 7 is a diagram showing a side view of the circuit board assembly of FIG. 5 after leads have been attached to the die and to the circuit board in accordance with an embodiment of the invention.
Figure 8:
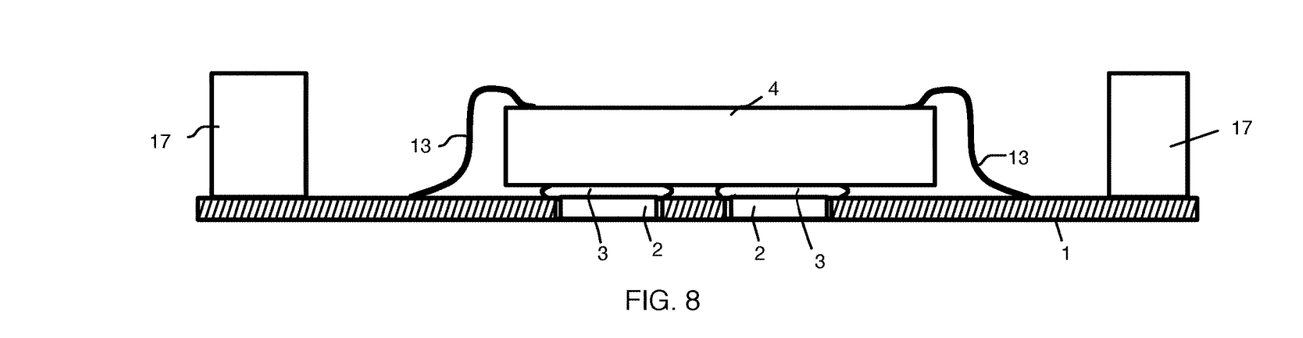
FIG. 8 is a diagram showing a side view of the circuit board assembly of FIG. 7 after dam material has been deposited over the first circuit board in accordance with an embodiment of the invention.

Leads are soldered 106 to the semiconductor die, and to the circuit board. In FIG. 7, leads 13 are wire bonded 106 to die 4 and the circuit board 1 to electrically couple die 4 to circuit board 1 as discussed in relation to step 106. Then, optionally, a dam is formed 107 around the die 4, the area inside the dam is filled 109 with filler material and a curing process is performed 109 to encapsulate the die. In FIG. 8, a dam 17 is built up around die 4 and in FIG. 9 a filler material 19 is injected into the area defined by the dam 17. In one specific embodiment the filler material 19 is Delo Monopox (e.g., the dam could be GE785 and the fill material could be GE725). The curing process could include heating at 165° C. for 60 minutes. In one embodiment the dam material is an adhesive heat-cured, thixotropic high viscosity epoxy casting resin with viscosity between 55,000 and 860,000 mPa·s; and the filler material is an adhesive heat-cured, thixtropic low viscosity epoxy casting resin with a viscosity between 2700 and 80,000 mPa·s.

Figure 9:
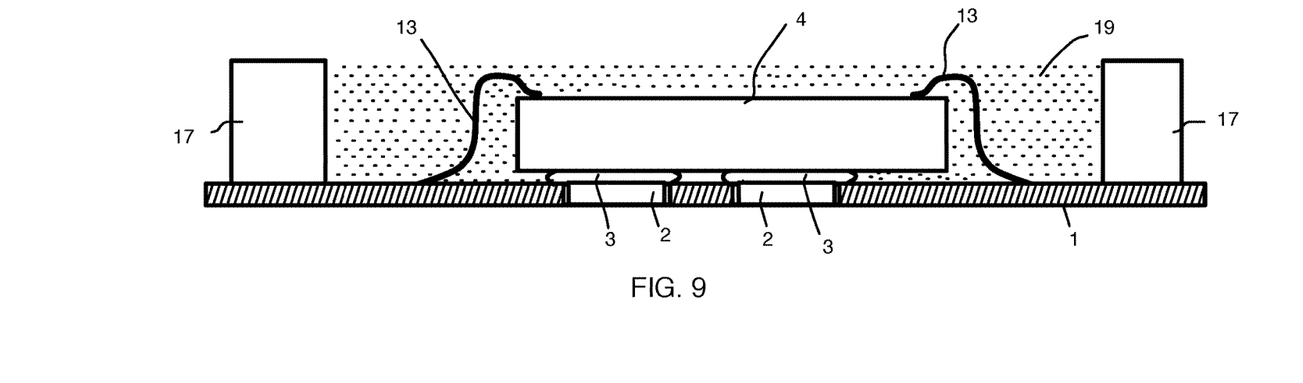
FIG. 9 is a diagram showing an embodiment of circuit board assembly having filler material that extents within the dam in accordance with an embodiment of the invention.

The filler material may be thermally conductive to further facilitate cooling of die 4. In one embodiment the filler material 19 is CVDD paste. The CVDD paste may be the same material as CVDD paste 3, or may have a lower CVDD content than CVDD paste 3 to reduce cost.

Figure 10:
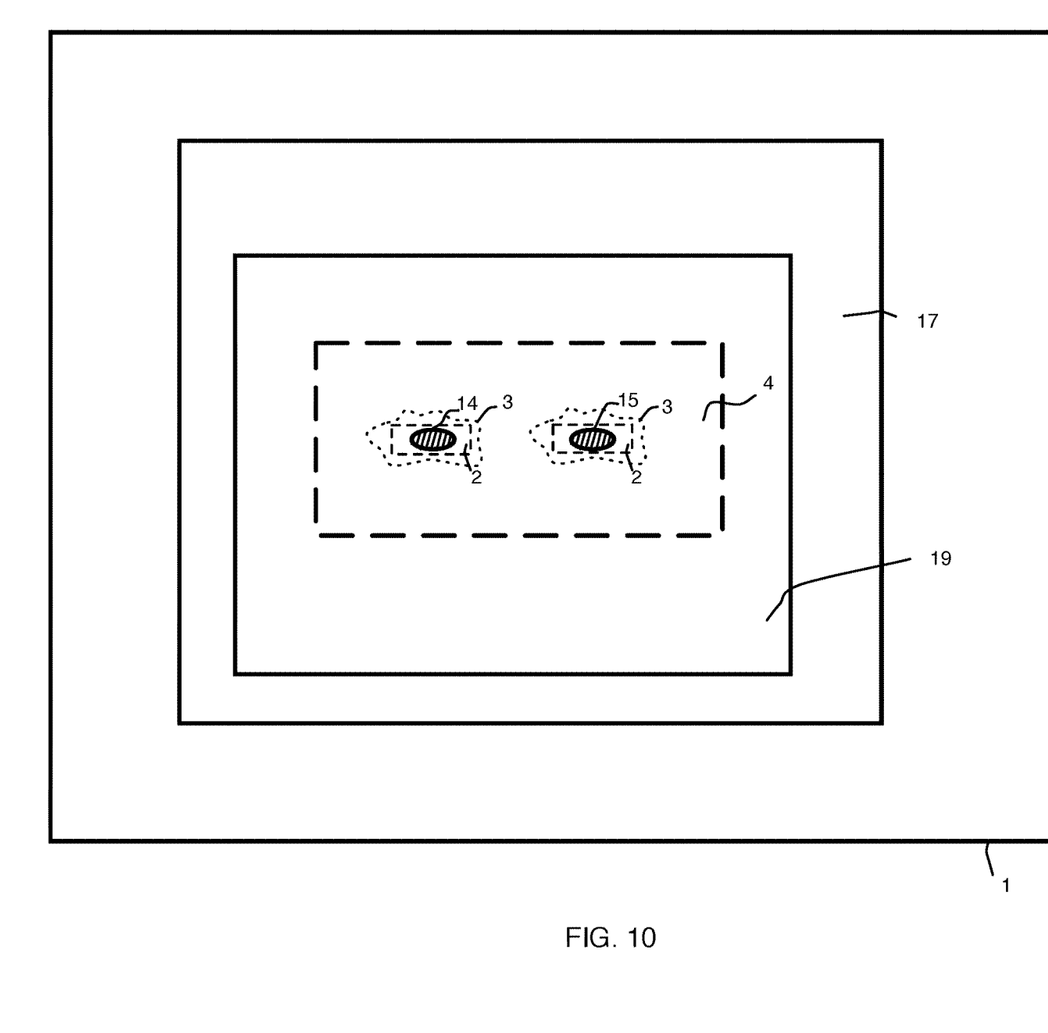
FIG. 10 is a diagram showing a top view of the circuit board of FIG. 9 in accordance with an embodiment of the invention.

The completed board assembly of FIGS. 8, 9 includes circuit board 1, openings 10, 11 extending through the circuit board 1, and CVDD windows 2 extending within the openings. Layer of thermally conductive paste 3 extends over each CVDD window 2, and semiconductor die 4 that extends over layer of thermally conductive paste 3 such that each hot-spot at least partially overlies a CVDD window 2. Leads 13 extend from semiconductor die 4 to circuit board 1 for electrically coupling semiconductor die 4 to circuit board 1. In the embodiment shown in FIGS. 9-10, dam 17 extends around die 4 and filler material 19 extends within the dam 17 encapsulating semiconductor die 4.

After completion of the assembly, in operation cooling is applied to the bottom of the board to remove heat transferred from the hot spots 14, 15 through the thermal path comprising layer of thermally conductive paste 3 and CVDD windows 2. The cooling may be an air-cooled system or a liquid (e.g., water) cooled system.

In the embodiment shown in FIGS. 1-9 CVDD windows 2 are shown that have a thickness that is the same as the thickness of circuit board 1. However, alternatively, CVDD windows 2 may have a thickness that is greater than the thickness of circuit board 1. In one embodiment that is illustrated in FIG. 16 an assembly 78 includes CVDD window 72 that extends above the top surface of the circuit board 1.

In an embodiment that is illustrated in FIG. 17 an assembly 88 includes CVDD window 82 that extends below the bottom surface of the circuit board 1.

In one embodiment that is illustrated in FIG. 18 an assembly 98 is shown that includes CVDD window 92 that extends both above the top surface of the circuit board 1 and below the bottom surface of the first circuit board.

Figure 11:
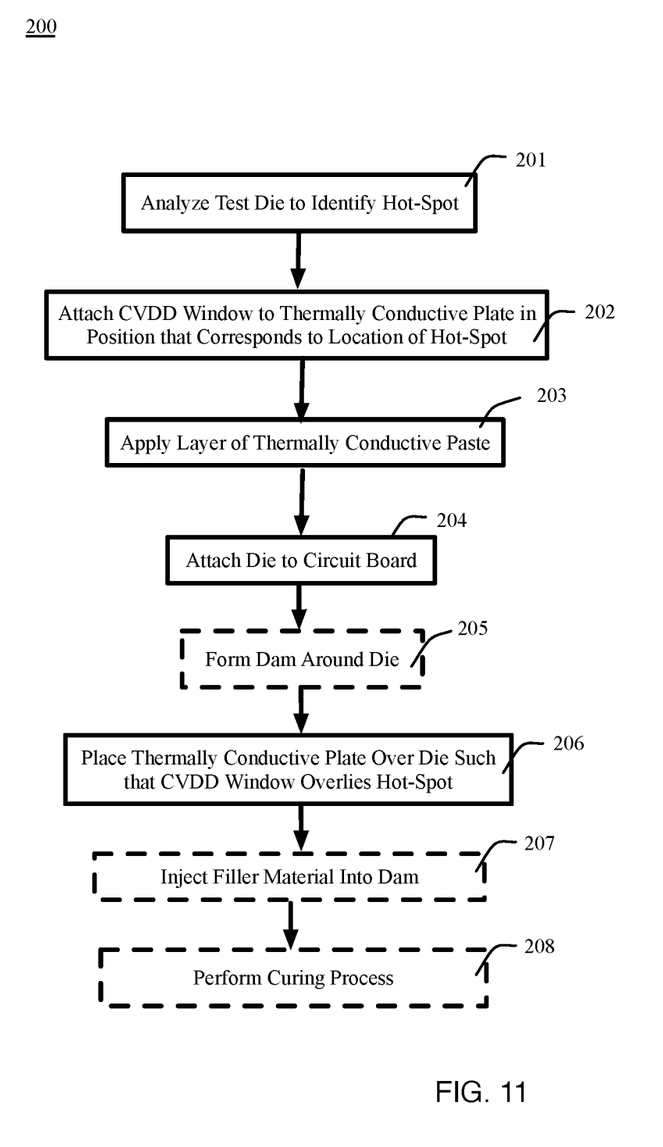
FIG. 11 is a block diagram showing a method for forming a board assembly having CVDD windows in accordance with an embodiment of the invention.

A method 200 for forming a board assembly is shown in FIG. 11 to include analyzing 201 the thermal properties of a plurality of test semiconductor die under nominal operation to identify the location of hot-spots in the semiconductor die. This step may be performed in the same manner as step 101 of FIG. 1. In the exemplary embodiment shown in FIGS. 13-15 step 201 is performed prior to the assembly process of steps 202-209 to identify hot-spots 23 and 24. It is appreciated that the process of identifying the location of hot-spots 23-24 will be done on a test die prior to the assembly process, and not necessarily determined using the semiconductor die 40 that will be used in the assembly process.

One or more CVDD windows are attached 202 to a thermally conductive plate in positions corresponding to the locations of the identified hot-spots.

Figure 12:
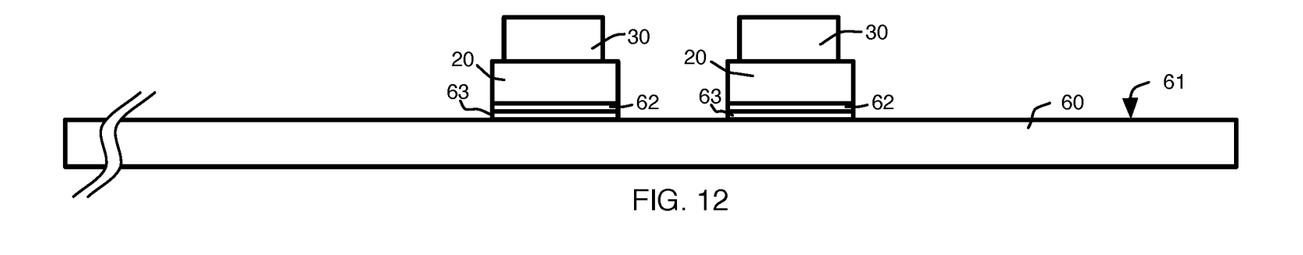
FIG. 12 is a diagram showing an expanded side view of CVDD windows that are attached to a thermally conductive plate, after a layer of thermally conductive paste has been deposited over the CVDD windows, in accordance with an embodiment of the invention.

In one embodiment that is illustrated in FIG. 12, step 202 is performed by attaching CVDD window(s) 20 to a surface 61 of thermally conductive plate 60. Thermally conductive plate 60 may be a metal plate such as, for example, a flat Nickel/Silver alloy plate, having a thickness of 100 μm or 200 μm. Thermally conductive plate 60 may also be thermally conductive ceramic. In alternate embodiments (not shown) the thermally conductive plate 60 may be curved at the edges.

In the embodiment of FIG. 12, step 202 is performed by depositing a thin layer of gold 62 over a first surface of the CVDD window 20 using a Chemical Vapor Deposition (CVD) process. Because it is so thin, the material cost of the layer of gold is not expensive. Solder paste 63 is then applied to either to surface 61 of thermally conductive plate 60 or to the layer of gold 62, and the CVDD window 20 is placed onto thermally conductive plate 60 such that the solder paste 63 extends between layer of gold 62 and the surface 61 of the thermally conductive plate 60. A heating process step is performed to melt the solder paste 63, soldering the CVDD window 20 to the thermally conductive plate 60. The gold 62 and solder paste 63 provide excellent thermal conductivity between the first surface of each CVDD window 20 and the surface 61 of thermally conductive plate 60.

Alternatively, step 202 may be performed by applying thermally conductive adhesive (either to surface 61 of thermally conductive plate 60 or to a first surface of CVDD window 20), placing CVDD window 20 against thermally conductive plate 60 and curing the adhesive.

In the embodiment of method 200, all of the CVDD windows 20, taken together, have a footprint that is less than twenty percent of the footprint of the semiconductor die. However, it has been found that in many instances hot-spots cover less than two percent of the die area. In these embodiments, the amount of CVDD window material of all of the CVDD windows 20, taken together, will be from two to four percent of the die area.

A layer of thermally conductive paste is applied 203. The thermally conductive paste 30 may be the same material as the thermally conductive paste applied in step 104. In the present embodiment a layer of thermally conducting paste less than 40 μm thick is applied over each CVDD window 20, i.e. over a second surface of each CVDD window 20, the second surface of each CVDD window 20 opposing the first surface thereof.

Figure 13:
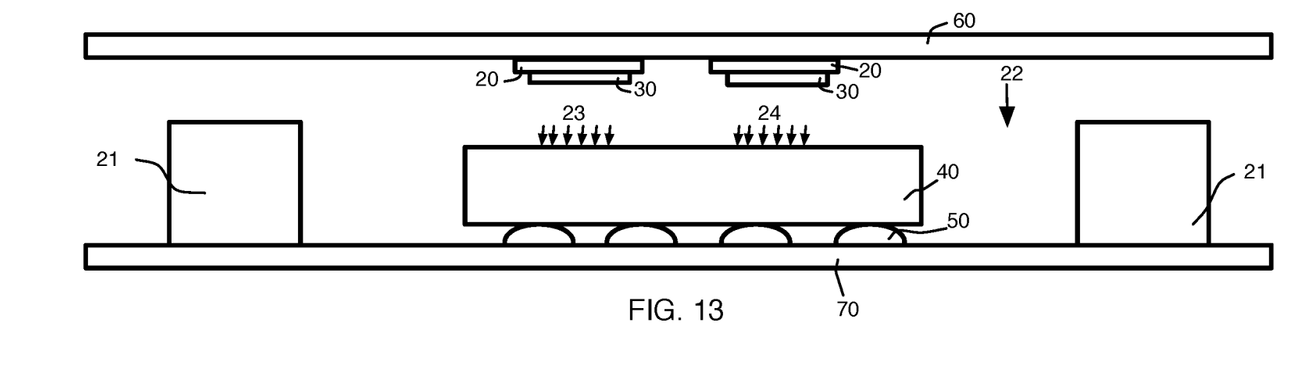
FIG. 13 is a diagram showing a side view of the circuit board assembly of FIG. 12 after the thermally conductive plate has been flipped over and positioned over a semiconductor die such that the CVDD windows overlie hot-spots of the die in accordance with an embodiment of the invention.

In the embodiment shown in FIGS. 12-13, the layer of thermally conductive paste 30 is selectively applied so that at least a portion of the second surface 33 of each CVDD window 20 is overlaid with, and in direct contact with, the layer of conductive paste 30. Alternatively, the thermally conductive paste 30 may be applied to the semiconductor die 40.

The semiconductor die is attached to the circuit board 204. The embodiment shown in FIG. 13 shows semiconductor die 40 that is attached to circuit board 70 by a Ball Grid Array (BGA) 50. BGA 50 electrically and physically couples semiconductor die 40 to circuit board 70.

Figure 14:
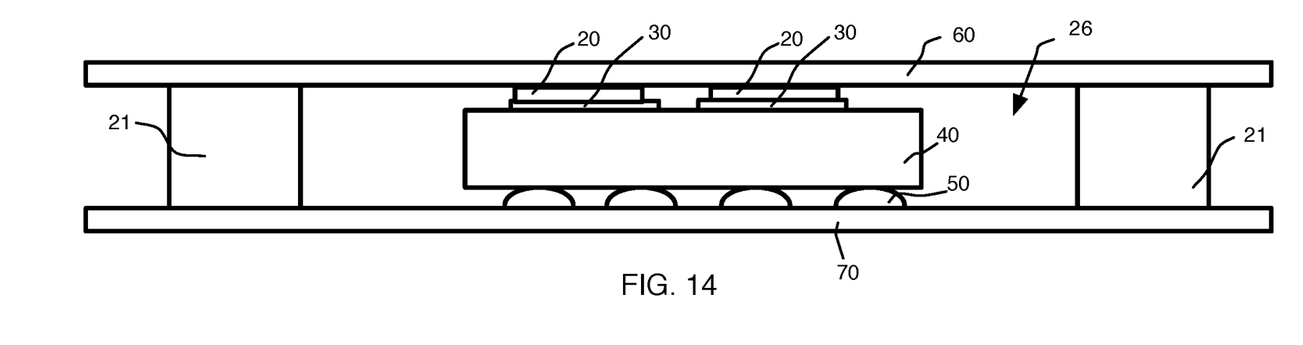
FIG. 14 is a diagram showing a side view of the circuit board assembly of FIG. 13 after the thermally conductive plate has been placed over the semiconductor die in accordance with an embodiment of the invention.

Optionally, a dam is formed 205 around the semiconductor die. In the embodiment of FIGS. 13-14 a dam 21 is formed that extends around semiconductor die 40.

The thermally conductive plate is placed 206 over the semiconductor die. Step 206 may be performed by flipping over the thermally conductive plate, precisely aligning the thermally conductive plate relative to the die and pressing the thermally conductive plate against the die such that each CVDD window overlies a corresponding hot-spot.

Optionally, filler material is injected 207 into the dam and a curing process is performed 208 to cure the filler material and the dam material. Step 205, 207 and 208 may utilize the same materials as are used in steps 107-108 and the encapsulation process may be performed in the same manner as steps 107-109 of FIG. 1.

In the embodiment shown in FIG. 13 the analysis of step 201 has identified hot-spots 23 and 24. Thermally conductive plate 60 is precisely positioned over semiconductor die 40 so that each CVDD window 20 overlies a respective identified hot-spot. In the present embodiment thermally conductive plate 60 is pressed against the semiconductor die 40 as shown by arrow 22 so as to squidge the layer of thermally conductive paste 30 between CVDD window 20 and the top of die 40, causing the layer of thermally conductive paste 30 to extend laterally as shown in FIGS. 14-15 and to have reduced thickness.

In the embodiment shown in FIG. 14, each CVDD window 20 is attached to thermally conductive plate 60 and extends laterally over a corresponding hot-spot 23, 24 on semiconductor die 40, and portion of the layer of thermally conductive paste 30 extends below each CVDD window 20, between the second surface of the CVDD window 20 and the top of the semiconductor die 40.

Figure 15:
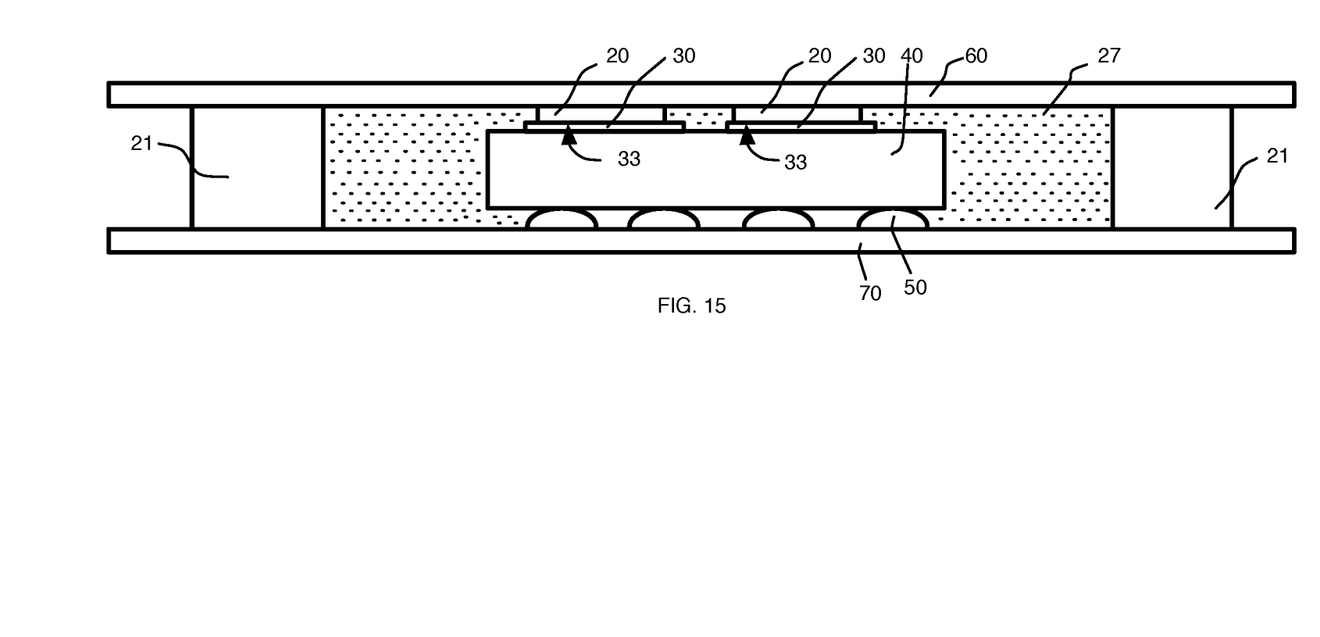
FIG. 15 is a diagram showing an embodiment of the circuit board assembly having thermally conductive paste in the void that extents within the dam and between the first circuit board and the thermally conductive plate in accordance with an embodiment of the invention.

Void, 26 is either left filled with air as shown in FIG. 14 or is filled with filler material 27 as is shown in FIG. 15. In the present embodiment, filler material 27 is thermally conductive material such as thermally conductive paste 30 to further facilitate cooling of die 4. In one embodiment filler material 27 is CVDD paste (e.g., the same material as CVDD paste 3). In another embodiment, filler material 27 has a lower CVDD content than CVDD paste 3 to reduce cost.

In the embodiment shown in FIGS. 12-14 the size of each CVDD window 20 is greater than the size of the respective underlying hot-spot 23, 24 such that each CVDD window 20 extends over and is in thermal contact with the entire area of the underlying hot-spot. The lateral extent of the thermally conductive paste 30 is greater than the lateral extent of hot-spot 23 along the top surface of semiconductor die 40 such that the entire area of the top surface of semiconductor die 40 that lies within hot-spot 23 is in direct contact with thermally conductive paste 30. The lateral extent of CVDD window 20 that overlies hot-spot 23 is shown to be less than the lateral extent of the underlying thermally conductive paste 30 such that the entire area of the second surface 33 of the CVDD window 20 is in direct contact with thermally conductive paste 30. Thereby, a thermally conductive path for expelling heat is provided across the entire lateral area of hot-spot 23 through the top surface of die 40, the thermally conductive path comprising thermally conductive paste 30 and CVDD window 20 to thermally conductive plate 60.

Similarly, the lateral extent of hot-spot 24 along the top surface of semiconductor die 40 is less than the lateral extent of the underlying thermally conductive paste 30 such that the entire area of the top surface of semiconductor die 40 that lies within hot-spot 24 is in direct contact with thermally conductive paste 30. Also, the lateral extent of CVDD window 20 that overlies hot-spot 24 is less than the lateral extent of the underlying thermally conductive paste 30 such that the entire area of the second surface 33 of the CVDD window 20 is in direct contact with thermally conductive paste 30. Thereby, a thermally conductive path for expelling heat is provided across the entire area of hot-spot 24, the thermally conductive path comprising thermally conductive paste 30 and CVDD window 20 to thermally conductive plate 60.

In the present embodiment, all of the CVDD windows 2, taken together have a footprint that is less than twenty percent of the footprint of the semiconductor die. It has been found that in many instances hot-spots cover less than two percent of the die area. In these embodiments, the amount of CVDD window material purchased, which is generally sold based on the lateral area of the cut material, may be from two to four percent of the die area. Thus, only a small amount of CVDD material is being used, saving on material cost. The positioning of the CVDD windows directly over or under the hot-spots provides the thermal conductivity necessary to cool the hot-spots.

In one embodiment the footprint of each CVDD window 2 is between one and five percent of the footprint of the die.

After completion of the assembly, in operation cooling is applied to the top of the metal plate 60 to remove heat from the hot spots 23, 24 transferred via the now provided thermally conductive path. The cooling may be an air-cooled system or a liquid (e.g., water) cooled system.

Figure 19:
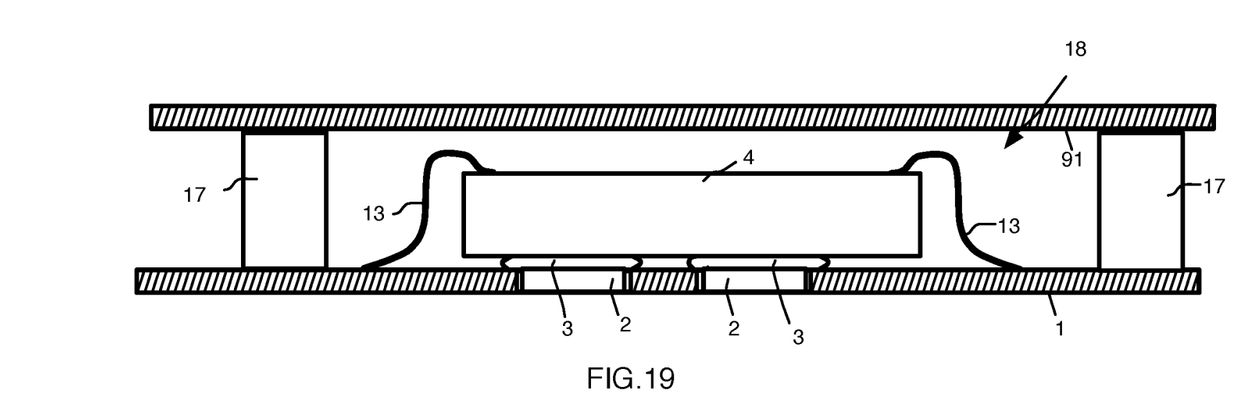
FIG. 19 is a diagram showing a side cross-sectional view of a circuit board assembly that includes two circuit boards and in which the void that extends inside of the dam remains filled with air, in accordance with an embodiment of the invention.
Figure 20:
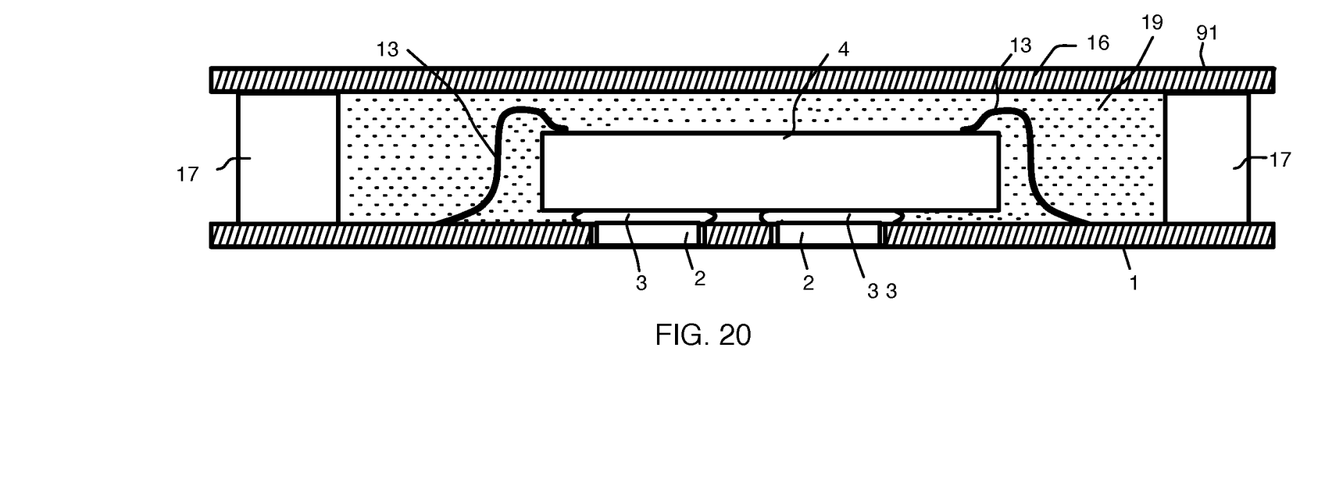
FIG. 20 is a diagram showing a side cross-sectional view of a circuit board assembly that includes two circuit boards and in which the void that extends inside of the dam has been filled with filler material, in accordance with an embodiment of the invention.

FIG. 19 illustrates an embodiment which steps 101-107 of method 100 have been performed. Then an additional circuit board 91 is placed over dam material 17 so that it is in contact with dam material 17. The curing process of step 109 may then be performed to form a multi-board assembly shown in FIG. 19. In this embodiment, the void 18 between circuit board 1, additional circuit board 91 and dam material 17 is filled with air. In the embodiment shown in FIG. 20, step 108 is performed such that the void is filled with filler material 19 and step 109 is performed to cure the filler material 19. Filler material 19 may be the same material as filler 19 described in relation to FIG. 9.

Figure 21:
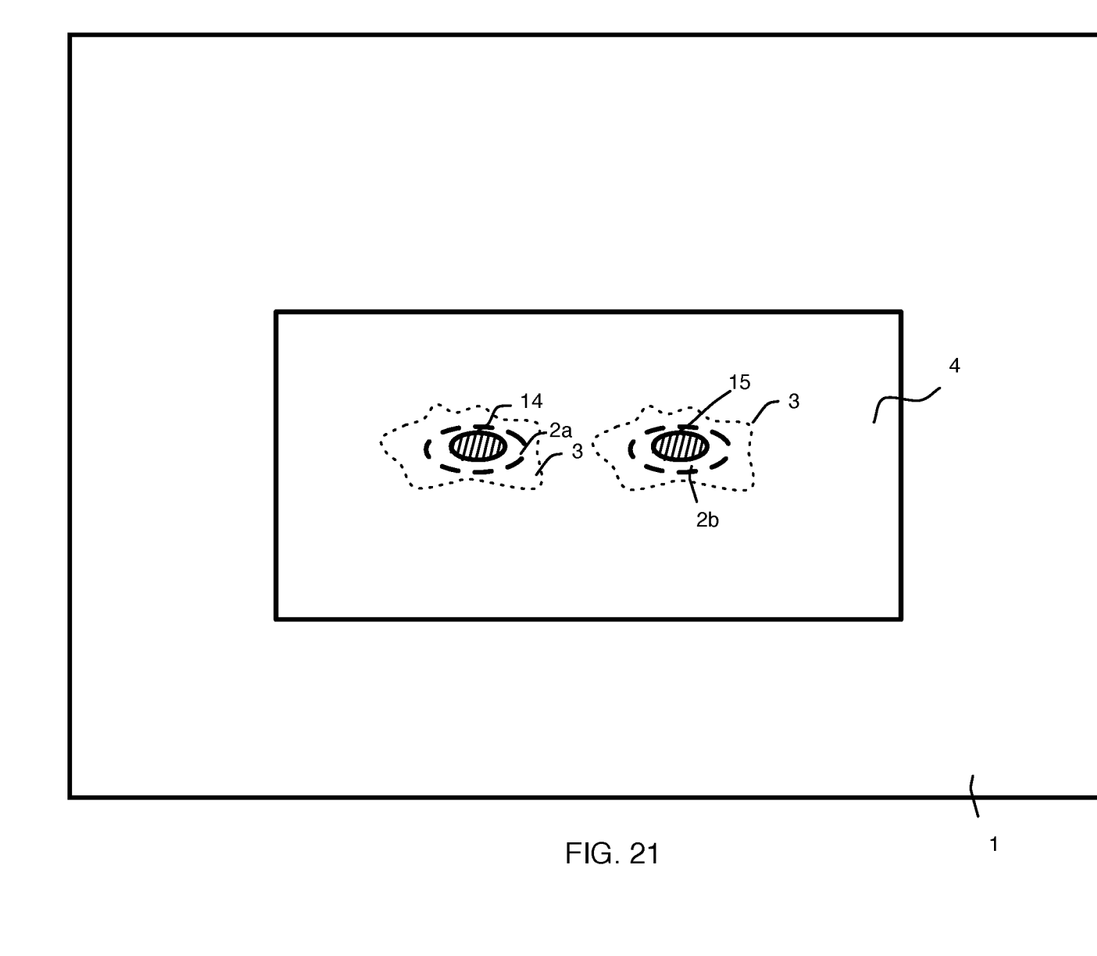
FIG. 21 is a diagram showing a top view of a circuit board assembly, and illustrates an embodiment in which the CVDD window has an oval shape in accordance with an embodiment of the invention.

Methods 100 and 200 are illustrated in FIGS. 1-19 as having a CVDD window 2, 20 having a rectangular shape. However, it is appreciated that CVDD windows 2, 20 could have other shapes such as rounded shapes. In the exemplary embodiment shown in FIG. 21, CVDD windows 2a and 2b are shown that have an oval shape.

Also, though the examples show two CVDD windows 2, 20 it is appreciated that a single hot-spot may be identified in which case a single CVDD window 2 is used.

An embodiment of the present invention includes a board assembly comprising: a circuit board, an opening extending through the first circuit board; a CVDD window extending within the opening; a layer of thermally conductive paste extending over the CVDD window; a semiconductor die extending over the layer of thermally conductive paste such that a hot-spot on the semiconductor die overlies the CVDD window; and leads that extend from the semiconductor die to the circuit board for electrically coupling the semiconductor die to the circuit board.

An embodiment of the present invention shows a board assembly comprising: a circuit board; a semiconductor die electrically coupled to the circuit board; a CVDD window; a layer of thermally conductive paste in direct contact with a first surface of the CVDD window along the full extent of the first surface of the CVDD window, and in direct contact with the semiconductor die, the layer of thermally conductive paste positioned so that it covers a hot-spot on the semiconductor die, the CVDD window having a footprint that is less than twenty percent of the footprint of the semiconductor die; a thermally conductive plate that is bonded to a second surface of the CVDD window, the second surface opposite the first surface; and a ball grid array that extends between the semiconductor die and the circuit board.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming a board assembly comprising:
    identifying a location of a hot-spot on a semiconductor die;
    cutting an opening in a circuit board corresponding to the location of the identified hot-spot;
    inserting a Chemical Vapor Deposition Diamond (CVDD) window into the opening;
    applying a layer of thermally conductive paste over the CVDD window; and
    placing the semiconductor die over the layer of thermally conductive paste such that the CVDD window underlies the hot-spot on the semiconductor die and a surface of the semiconductor die is in direct contact with the layer of thermally conductive paste.

2. The method of claim 1, further comprising: attaching leads to the semiconductor die and the circuit board to electrically couple the semiconductor die to the circuit board.

3. The method of claim 2, further comprising: forming a dam around the semiconductor die and attaching an additional circuit board to the dam so as to enclose the semiconductor die within the dam and between the circuit board and the additional circuit board.

4. The method of claim 3, further comprising: dispensing a filler material within the enclosure.

5. The method of claim 4, wherein the filler material comprises diamond paste.

6. The method of claim 1, wherein the CVDD window has a thickness that is the same as a thickness of the circuit board.

7. The method of claim 1, wherein the CVDD window has a thickness that is greater than a thickness of the circuit board, the CVDD window extending above a top surface of the circuit board.

8. The method of claim 1, wherein the CVDD window has a thickness that is greater than a thickness of the circuit board, the CVDD window extending below a bottom surface of the circuit board.

9. The method of claim 1, wherein the CVDD window has a thickness that is greater than a thickness of the circuit board, the CVDD window extending above a top surface of the circuit board and extending below a bottom surface of the circuit board.

10. The method of claim 1, wherein the layer of thermally conductive paste comprises diamond paste.

11. A method for forming a board assembly comprising:
    identifying a location of a hot-spot on a semiconductor die;
    attaching a Chemical Vapor Deposition Diamond (CVDD) window onto a surface of a thermally conductive plate, in a location corresponding to the location of the hot-spot on the semiconductor die;
    applying a layer of thermally conductive paste over the attached CVDD window;
    attaching the semiconductor die to a circuit board such that the semiconductor die is electrically coupled to the circuit board; and
    placing the thermally conductive plate over the semiconductor die so that the layer of thermally conductive paste is in contact with the semiconductor die and the CVDD window overlies the hot-spot on the semiconductor device.

12. The method of claim 11, wherein the thermally conductive paste comprises diamond paste.

13. The method of claim 11, wherein attaching the semiconductor die to the circuit board comprises attaching the semiconductor die to the circuit board using a ball grid array that extends between the semiconductor die and the circuit board.

14. The method of claim 11, further comprising:
forming a dam around the semiconductor die, such that said thermally conductive plate and said dam creates an enclosure surrounding the semiconductor die; and
dispensing a filler material within the enclosure.

15. The method of claim 14, wherein the filler material comprises diamond paste.

16. The method of claim 15, further comprising performing a curing process to cure the filler material and the dam.

* * * * *